(12) United States Patent
Balardeta et al.

(10) Patent No.: US 6,657,464 B1
(45) Date of Patent: Dec. 2, 2003

(54) METHOD AND CIRCUIT TO REDUCE JITTER GENERATION IN A PLL USING A REFERENCE QUADRUPLER, EQUALIZER, AND PHASE DETECTOR WITH CONTROL FOR MULTIPLE FREQUENCIES

(75) Inventors: Joseph James Balardeta, Del Mar, CA (US); Allen Carl Merrill, Encinitas, CA (US); Wei Fu, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/132,425

(22) Filed: Apr. 25, 2002

(51) Int. Cl.[7] .................................................. H03L 7/06
(52) U.S. Cl. ........................ 327/147; 327/156; 327/163; 327/294; 331/11; 331/DIG. 2
(58) Field of Search ................................. 327/147, 150, 327/156, 159, 162–163, 3, 16, 40, 291–294, 43, 47, 49, 551, 552; 331/1 A, 11, 18, 25, DIG. 2; 375/376

(56) References Cited

U.S. PATENT DOCUMENTS

| | | | |
|---|---|---|---|
| 5,227,671 A | * 7/1993 | Ehrlich | 327/108 |
| 5,260,979 A | * 11/1993 | Parker et al. | 375/108 |
| 5,521,948 A | * 5/1996 | Takeuchi | 375/219 |
| 5,566,204 A | * 10/1996 | Kardontchik et al. | 375/376 |
| 5,786,715 A | * 7/1998 | Halpete | 327/116 |
| 5,838,205 A | * 11/1998 | Ferraiolo et al. | 331/2 |
| 5,963,071 A | * 10/1999 | Dowlatabadi | 327/175 |
| 5,977,806 A | * 11/1999 | Kikuchi | 327/157 |
| 6,028,460 A | * 2/2000 | McCollum et al. | 327/105 |
| 6,107,891 A | * 8/2000 | Coy | 331/18 |
| 6,211,741 B1 | * 4/2001 | Dalmia | 331/11 |
| 6,295,327 B1 | * 9/2001 | Takla | 375/375 |
| 6,310,521 B1 | * 10/2001 | Dalmia | 331/11 |
| 6,356,158 B1 | * 3/2002 | Lesea | 331/11 |
| 6,456,132 B1 | * 9/2002 | Kouzuma | 327/159 |
| 6,538,520 B1 | * 3/2003 | Merrill et al. | 331/18 |

OTHER PUBLICATIONS

Alfke, Peter, Frequency/Phase Comparator For Phase–Locked Loops, Dec. 2, 1996, pp. 1–2, XAPP 028 (Version 1.1).

* cited by examiner

Primary Examiner—Timothy P. Callahan
Assistant Examiner—Hai L. Nguyen
(74) Attorney, Agent, or Firm—Incaplaw; Terrance A. Meador

(57) ABSTRACT

A low-jitter phase-locked loop (PLL) circuit includes a reference signal generator and a PLL. The reference signal generator is configured to quadruple a frequency of a first reference signal to produce a second reference signal. The PLL includes a filter coupled in series with a voltage controlled oscillator (VCO), and a frequency phase detector configured to generate a first error signal based on a frequency difference between the second reference signal and a first divided VCO output signal. The PLL further includes a phase detector configured to generate a second error signal based on a phase difference between the second reference signal and a second divided VCO output signal at each rising and falling transition of the second reference signal. The PLL further includes a multiplexer configured for initially receiving the first error signal until the frequencies of the first divided VCO output signal feedback signal and the second reference signal match, and thereafter for receiving the second error signal, and to provide the first or second error signal to the filter.

13 Claims, 4 Drawing Sheets

METHOD AND CIRCUIT TO REDUCE JITTER GENERATION IN A PLL USING A REFERENCE QUADRUPLER, EQUALIZER, AND PHASE DETECTOR WITH CONTROL FOR MULTIPLE FREQUENCIES

BACKGROUND OF THE INVENTION

The present invention relates generally to reducing jitter in a phase locked loop (PLL), and more particularly to methods and apparatus for reducing jitter using two reference frequency doublers, two equalizers, and a phase detector.

A conventional phase locked loop (PLL) typically includes a frequency phase detector which receives a reference signal, a filter, a voltage-controlled oscillator (VCO), and a divider circuit. If the reference signal received by the frequency phase detector has a relatively low frequency, a large feedback divider ratio is required by the PLL. A large feedback divider ratio requires that the divider circuit have a relatively large number of dividers, which undesirably introduces phase "jitter" into the signals. Jitter is an adverse signal effect which can lead to noise and even logic errors at higher communication speeds. The large feedback divider ratio also means that the loop gain of the PLL will be lower for a given supply voltage, which makes the gain distribution for noise less ideal and also increases jitter.

One solution to this problem is to increase the frequency of the reference signal received by the frequency phase detector. However, conventional XOR-based frequency doublers typically distort the duty cycle of reference signals due to integrated circuit (IC) process variations. This distortion may be severe enough to render the approach ineffective.

SUMMARY OF THE INVENTION

This invention provides an improved phase-locked loop (PLL) circuit. In accordance with one embodiment of the invention, a PLL circuit includes a reference signal generator having an input, a frequency quadrupler, an equalizer, and an output. The PLL circuit further includes a filter having an output coupled with an input of a voltage-controlled oscillator (VCO), a first divider having an input coupled with an output of the VCO, and a frequency phase detector having a first input coupled to an output of the first divider and a second input coupled to the reference signal generator output. The PLL circuit further includes a second divider having an input coupled with the output of the VCO, and a phase detector having a first input coupled to an output of the second divider and a second input coupled to the reference signal generator output. The PLL circuit further includes a multiplexer having a first input coupled to an output of the frequency phase detector, a second input coupled to an output of the phase detector, and an output coupled to an input of the filter.

According to another embodiment of the invention, a PLL circuit configured for reduced jitter includes a reference signal generator configured to quadruple a frequency of a first reference signal to produce a second reference signal, and a filter coupled in series with a voltage controlled oscillator (VCO). The PLL circuit further includes a frequency phase detector configured to generate a first error signal based on a frequency difference between the second reference signal and a first divided VCO output signal, and a phase detector configured to generate a second error signal based on a phase difference between the second reference signal and a second divided VCO output signal at each rising and falling transition of the second reference signal. The PLL circuit further includes a multiplexer configured for initially receiving the first error signal until the frequencies of the first divided VCO output signal feedback signal and the second reference signal match, and thereafter for receiving the second error signal, and to provide the first or second error signal to the filter.

DETAILED DESCRIPTION OF THE PREFERRED EMBODIMENTS

According to the present invention, circuitry for a phase-locked loop (PLL) includes a reference signal generator comprising an input, a frequency quadrupler, an equalizer, and an output. The reference signal generator quadruples a frequency of a first reference signal to produce a second reference signal for the PLL.

The PLL circuit also includes a filter having an output coupled with an input of a voltage-controlled oscillator (VCO), a first divider having an input coupled with an output of the VCO, and a frequency phase detector having a first input coupled to an output of the first divider and a second input coupled to the reference signal generator output. The first divider and the frequency phase detector form part of a first feedback loop in which the frequency phase detector generates a first error signal based, at least in part, on a frequency difference between the second reference signal and a VCO output signal after being divided-down by the first divider.

The PLL circuit further includes a second divider having an input coupled with the output of the VCO, and a phase detector having a first input coupled to an output of the second divider and a second input coupled to the reference signal generator output. The second divider and phase detector form part of a second feedback loop in which the phase detector generates a second error signal based, at least in part, on a phase difference between the second reference signal and the VCO output after being divided-down by the second divider. In an embodiment, the phase difference is determined by sampling at each rising and falling edge of the second reference signal.

The PLL circuit still further includes a multiplexer having a first input coupled to an output of the frequency phase detector, a second input coupled to an output of the phase detector, and an output coupled to an input of the filter. The multiplexer can have, for example, a selection signal input configured to enable either the first input or the second input for receiving the first or second error signal, respectively. In one embodiment, upon start-up when the PLL is in an unlocked state, the first input is selected and the first error signal controls the VCO output signal. When the frequency of the second divided VCO output signal matches the frequency of the second reference signal, the PLL is locked with respect to frequency, and the second input is selected for receiving the second error signal.

An advantage of using a phase detector for generating an error signal is that the phase detector samples on both rising and falling transitions of an input reference signal, effectively doubling the reference signal frequency, and extracting more information from the reference signal. These advantages reduce jitter and improve the signal to noise ratio within the PLL.

Figure 1:
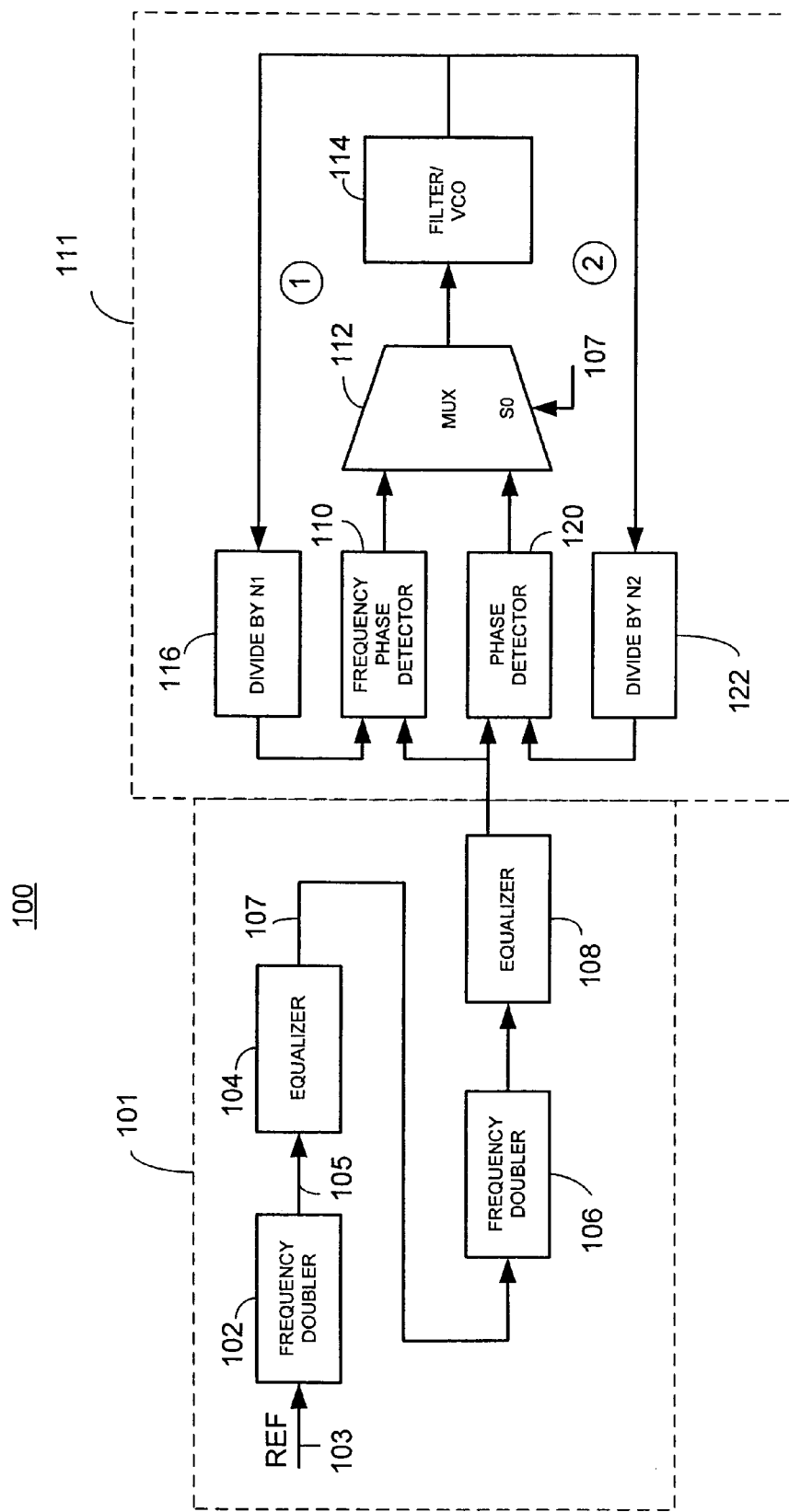
FIG. 1 is a schematic block diagram of a phase locked loop (PLL) circuit according to the present invention.

FIG. 1 illustrates a schematic block diagram of a PLL circuit 100 according to one embodiment of the invention. Preferably, the PLL circuit 100 is embodied in an integrated circuit (IC) device. Alternatively, the circuit 100 may be embodied as a software product. The PLL circuit 100 includes a reference signal generator 101 that provides a reference signal to a phase locked loop (PLL) 111. The reference signal generator 101 includes an input 103 for receiving a first reference signal having a first frequency, a first frequency doubler 102, and an output 105 for providing an intermediate reference signal having a second frequency that is approximately twice the first frequency. The output 105 of the first frequency doubler 102 is coupled to an input of a first equalizer 104. An output 107 of the equalizer is coupled to an input of a second frequency doubler 106, which produces a second reference signal having a third frequency that is approximately twice the second frequency, and four times the first frequency. The output of the second frequency doubler 106 is coupled to an input of a second equalizer 108. The output of the second equalizer 108 forms the input to the PLL 111.

The PLL 111 includes a frequency phase detector 110 and a phase detector 120, each having an input coupled to the input to the PLL 111. The output of the frequency phase detector 110 is coupled to a first input of a multiplexer 112, and the output of the phase detector is coupled to a second input of the multiplexer 112. The multiplexer 112 includes a selection signal input 107 that enables either the first input or the second input to receive an output of either the frequency phase detector 110 or phase detector 120, respectively. The multiplexer 112 has an output coupled to an input of a filter/voltage-controlled oscillator (filter/VCO) 114. A signal on the selected input is passed to the filter/VCO 114. Although shown as a single block, filter and VCO 114 can include a filter coupled in series with a VCO where an output of the filter is coupled to an input of the VCO.

An output of filter/VCO 114 is coupled to an input of a first divider 116, the output of which is coupled to a second input of the frequency phase detector 110. The output of filter/VCO 114 is also coupled to an input of a second divider 122, which has an output coupled to a second input of the phase detector 120. The first divider 116 has a frequency divider ratio of N1. The second divider 122 has a frequency divider ratio of N2. In one embodiment, N1 is equal to N2. Alternatively, N1 may be different from N2, depending on how the VCO is to be controlled in the unlocked and locked state.

The PLL thus includes two feedback loops (1) and (2). Feedback loop (1) is enabled upon power-up and when the PLL is in an unlocked state. Feedback loop (1) includes the frequency phase detector 110 generating a first error signal. The first error signal from the frequency phase detector 110 is selectively received on a first input of the multiplexer 112. Feedback loop (1) further includes the filter/VCO 114 and the first divider 116. Once the PLL has achieved lock, i.e. the frequency of the first divided VCO output signal equals the frequency of the second reference signal at the first and second inputs to the frequency phase detector, feedback loop (2) is enabled. Feedback loop (2) includes the phase detector 120 generating a second error signal. The second error signal from the phase detector 120 is received on a second input of the multiplexer 112. Feedback loop (2) also includes the filter/VCO 114 and the second divider 122. When the feedback loop (2) is enabled, the phase detector generates the second error signal based on a phase difference between the second divided VCO output signal and the second reference signal at the first and second inputs to the phase detector. In one exemplary embodiment, the phase difference is sampled at each rising and falling edge of the second reference signal.

Figure 2:
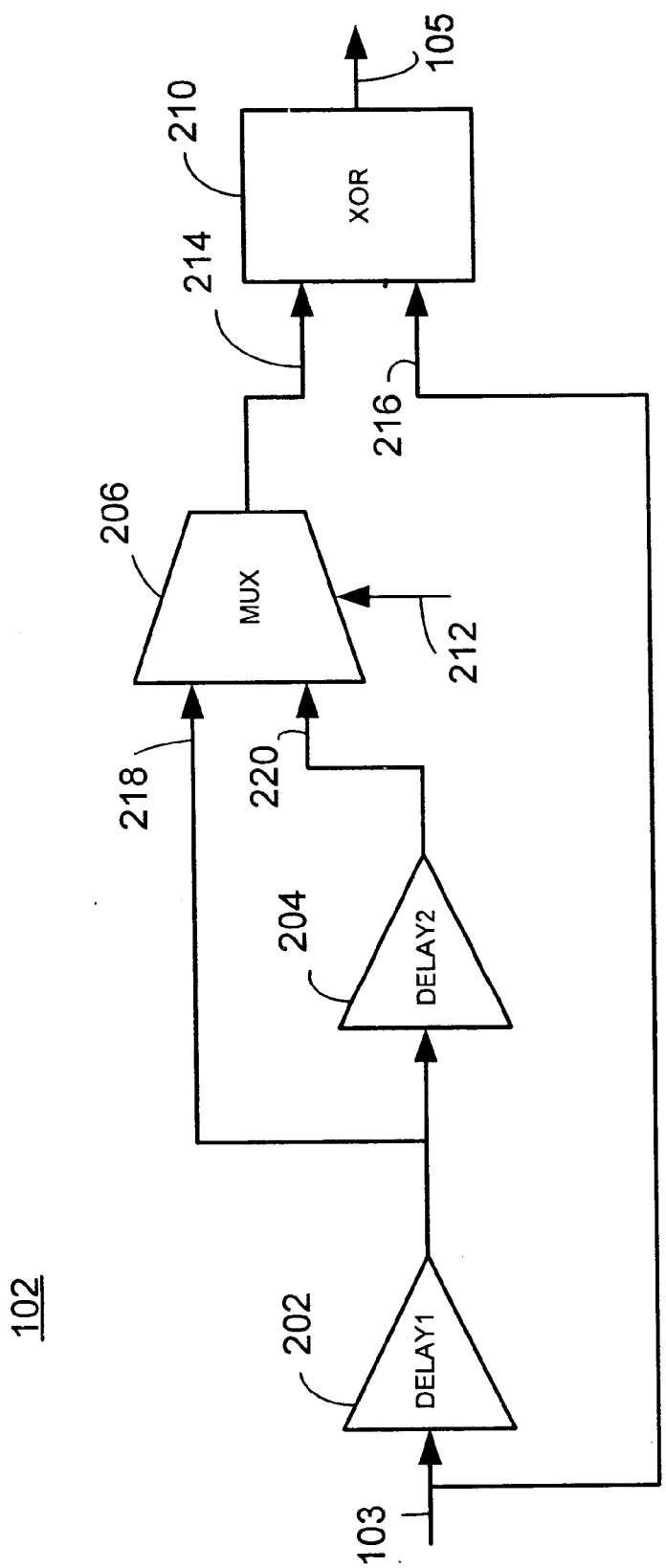
FIG. 2 is a schematic block diagram of a frequency doubler of FIG. 1.

Referring now to FIG. 2, a schematic block diagram of one suitable embodiment of a frequency doubler 102 of FIG. 1 is shown. Frequency doubler 102 includes a delay circuit 202, a delay circuit 204, a multiplexer 206, and an XOR circuit 210. Delay circuit 202 is configured to provide a 90° delay for a particular frequency X. Together, delay circuits 202 and 204 can be configured to provide a 90° delay for a different frequency Y, where each delay circuit 202 and 204 can provide a 45° delay for the frequency Y.

Delay circuit 202 has an input 103 which is also the input to reference signal generator 101 shown in FIG. 1, and an output coupled to both an input of delay circuit 204 and a first input 218 of multiplexer 206. Delay circuit 204 has an output coupled to a second input 220 of multiplexer 206. A first input 214 of XOR circuit 210 is coupled to an output of multiplexer 206, and a second input 216 of XOR circuit 210 is coupled to the input 118 of frequency doubler 104. A signal selection input 212 to multiplexer 206 is used for selectively coupling one of the first and the second inputs of multiplexer 206 to its output.

Several advantages are conferred with use of this reference signal generator. Conventional XOR-based frequency doublers typically distort the duty cycle of the signal waveform over the process corners of IC fabrication. In the present invention, however, two equalizers are used to help restore the duty cycle of the signal before it enters the frequency phase detector of the PLL. This increased (quadrupled) reference frequency at the input of the frequency phase detector allows the PLL to have a smaller feedback divider ratio and therefore fewer dividers; fewer dividers result in less circuitry in the PLL feedback path and reduces jitter. A reduced divider ratio also allows a higher loop gain for a given supply voltage, which produces a more ideal gain distribution for noise and reduces jitter as well.

Operation of each frequency doublers 102, 106 of FIG. 1 is described in more detail for a first reference signal having a frequency X. Referring back to FIG. 2, selection signal input 212 of multiplexer 206 is set such that the first (top) input is selected as the output of multiplexer 206 and the second (bottom) input is ignored. The first reference signal at a line 103 is received at the input of delay circuit 202 and at the input of XOR circuit 210 at a line 216. This first reference signal is delayed by delay circuit 202 so that a first out-of-phase signal is produced at the output of delay circuit 202 at a line 218. The first out-of-phase signal is passed through multiplexer 206 at its output at a line 214. Thus, the output of XOR circuit 210 is the XOR of the first reference signal having frequency X at line 216 and the first out-of-phase signal having frequency X at line 214.

Operation of the frequency doubler 102, 106 of FIG. 1 is now described for an alternative first reference signal having a frequency Y that is different from frequency X. For this embodiment, frequency Y is less than frequency X. Frequency Y may be, for example, 78 MHz. Referring back to FIG. 2, selection signal input 212 of multiplexer 206 is set such that the second (bottom) input is selected as the output of multiplexer 206 and the first (top) input is ignored. The alternative first reference signal at line 103 is received at the input of delay circuit 202 and at the input of XOR circuit 210 at line 216. This first reference signal is delayed by delay circuit 202 so that the first out-of-phase signal is produced at the output of delay circuit 202 at line 218, but the first out-of-phase signal is also delayed by delay circuit 204 so that a second out-of-phase signal is produced at its output at a line 220. The second out-of-phase signal is passed through multiplexer 206 at its output at line 214. Delay circuit 204 is configured as a 45° delay circuit for frequency Y and, since delay circuit 202 is also configured as a 45° delay circuit for frequency Y, the resulting signal has a total delay of 90°. The output of XOR circuit 210 at line 105 is the XOR of the alternative first reference signal having frequency Y at line 216 and the second out-of-phase signal having frequency Y at line 214.

As one skilled in the art will readily understand, circuitry of frequency doubler 102 of FIG. 2 may be expanded using additional delay circuits and multiplexer inputs for handling additional first reference signals having a range of frequencies. On the other hand, if a reference signal having only a single predetermined frequency is to be utilized and outputted, then delay circuit 204 and multiplexer 206 of FIG. 2 are not necessary and can be excluded. In this case, the output of delay circuit 202 is coupled directly to the first input of XOR circuit 210.

Figure 3:
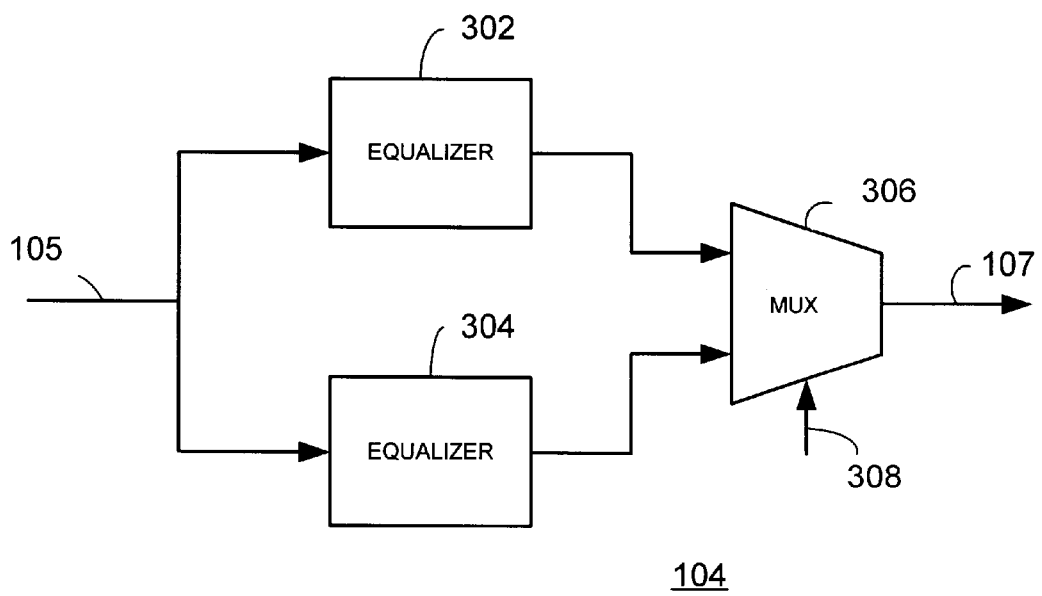
FIG. 3 is a schematic block diagram of an equalizer of FIG. 1.

FIG. 3 illustrates a schematic block diagram of a suitable equalizer 104 for use with the PLL circuit 100 shown in FIG. 1, in accordance with one preferred embodiment of the invention. Equalizer 104 includes an equalizer 302, an equalizer 304, and a multiplexer 306. Equalizers 302 and 304 may be referred to as "subequalizers" of equalizer 104. Inputs of equalizers 302 and 304 are coupled to the input of equalizer 104. Each one of equalizers 302 and 304 is a duty cycle equalizer utilizing conventional circuitry. More particularly, equalizer 302 is designed and tailored for use with a first reference signal having a frequency X, whereas equalizer 304 is designed and tailored for use with a second reference signal having a frequency Y which is different from frequency X. Multiplexer 306 has a first input coupled to an output of equalizer 302, and a second input coupled to an output of equalizer 304. A signal selection input 308 to multiplexer 306 is used for selectively coupling one of the first and the second inputs of multiplexer 306 to its output. The output 107 of multiplexer 306 is the output of equalizer 104 of FIG. 1.

Figure 4:
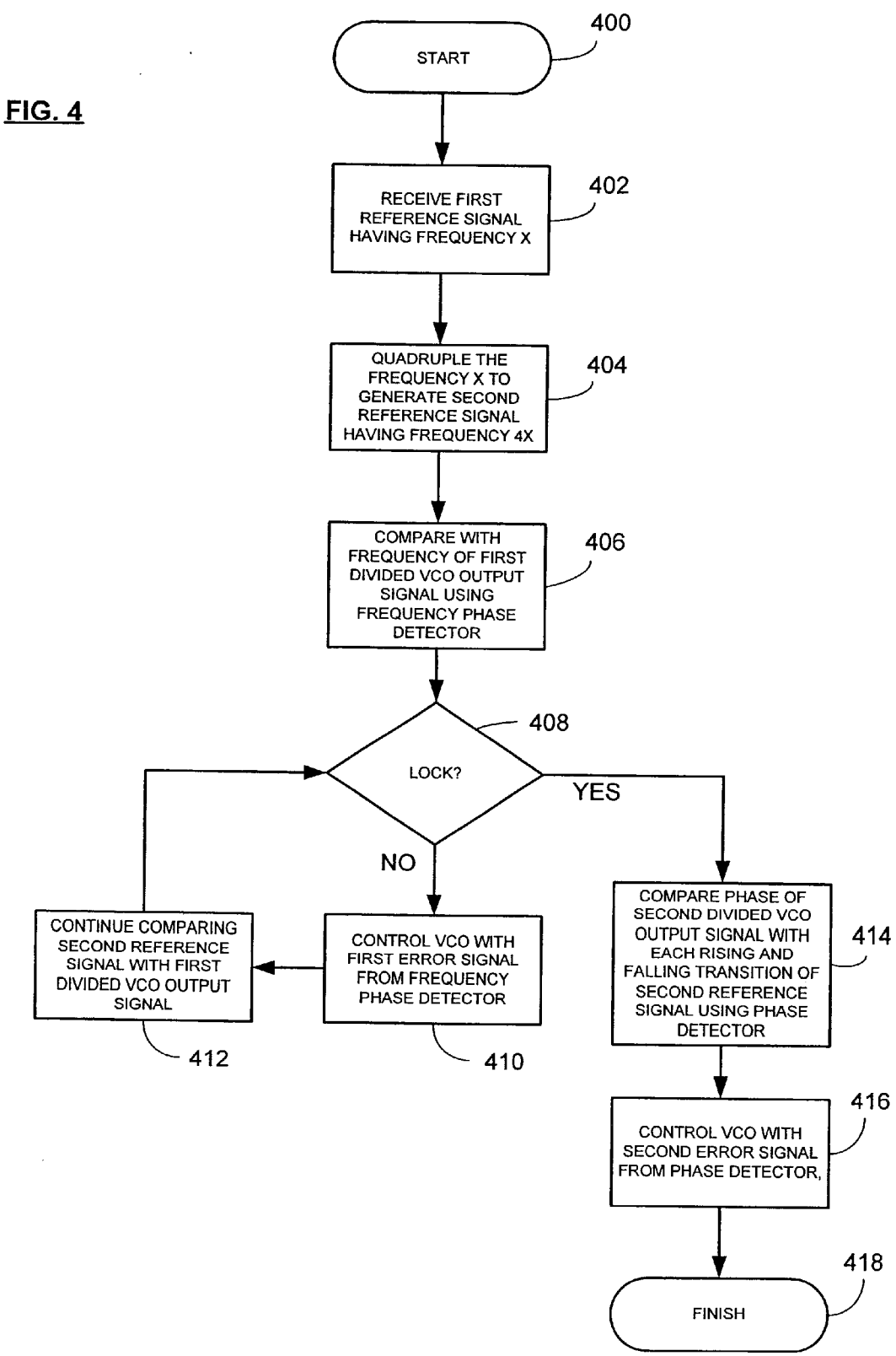
FIG. 4 is a flowchart showing a method of reducing jitter using a PLL circuit shown in FIG. 1 in accordance with the invention.

FIG. 4 illustrates a method for reducing jitter in a PLL, which can be performed using a PLL circuit shown in FIG. 1. In the following description, FIGS. 1 and 4 will be referred to in combination. Beginning at a start block 400 in FIG. 4, a first reference signal having a frequency X is received at the input 103 of the reference signal generator 101 (step 402). The function of the reference signal generator 101 is to generate a suitable reference signal for phase locked loop (PLL) 111. Frequency X may be, for example, about 155 MHz. Next the frequency X of the first reference signal is quadrupled by reference signal generator 101, preferably being doubled by frequency doubler 102 and doubled again by frequency doubler 106, to produce a second reference signal having a frequency 4*X (step 404). Frequency 4*X may be, for example, about 622 MHz. In accordance with one embodiment, the second reference signal may be equalized, all at once or after each frequency doubler, to remove adverse duty cycle distortion.

At step 406, the second reference signal is provided to an output 105 of the reference signal generator, to an input of the PLL 111. At power up, and while the PLL is in an unlock mode, a multiplexer 112 receives a first input selection signal S0 on select input 107, to enable a frequency phase detector 110 to generate a first error signal, based on a comparison between the second reference signal and a first divided-down VCO output signal (step 406). The first input selection signal S0 also disables an output of a phase detector 120 connected to a second input of the multiplexer. Selection of the frequency phase detector enables a first PLL loop (1), the operation of which controls and adjusts the operation of the VCO (step 410). The frequency phase detector 110 continues comparing the resultant first divided VCO output with the second reference signal (step 412) until their frequencies match and the PLL is in "lock," shown by decision node 408. Once in lock, the multiplexer selects to receive an output of the phase detector 120, and disables the output of the frequency phase detector 110, essentially enabling PLL loop (2) and disabling PLL loop (1).

Once enabled, the phase detector compares a phase difference between a second divided-down VCO output signal and the second reference signal (step 414). The comparison is made at each rising and falling transition of the second reference signal. The phase detector generates a second error signal for each out-of-phase comparison, and outputs the second error signal to the multiplexer 112 for controlling the VCO 114. The use of the phase detector 120, when the PLL is in frequency lock, effectively doubles again the first reference signal for use by the PLL. Accordingly, the second PLL loop (2) requires a smaller feedback divider ratio provided by the second divider 122. Fewer dividers results in less circuitry in the feedback path of the second feedback loop (2), which reduces jitter. A reduced divider ratio also allows for a higher loop gain for a given supply voltage, producing a more ideal gain distribution for noise, and which also reduces jitter.

It is to be understood that the above is merely a description of preferred embodiments of the invention and that various changes, alterations, and variations may be made without departing from the true spirit and scope of the invention as set forth in the appended claims. None of the terms or phrases in the specification and claims has been given any special particular meaning different from the plain language meaning to those skilled in the art, and therefore the specification is not to be used to define terms in an unduly narrow sense.

What is claimed is:

1. A phase-locked loop (PLL) circuit, comprising:

a reference signal generator configured to quadruple a frequency of a first reference signal to produce a second reference signal, the reference signal generator having an output for providing the second reference signal;

a filter/voltage controlled oscillator (VCO) having an input;

a frequency phase detector connected to the reference signal generator for generating a first error signal based on a frequency difference between the second reference signal and a first divided VCO output signal, the frequency phase generator having an output;

a phase detector connected to the reference signal generator for generating a second error signal based on a phase difference between the second reference signal and a second divided VCO output signal at each rising and falling transition of the second reference signal, the phase generator having an output; and a multiplexer having a first input connected to the output of the frequency phase generator, having a second input connected to the output of the phase generator, and having a control input for receiving a control signal causing the multiplexer to select the first error signal until the frequencies of the first divided VCO output signal feedback signal and the second reference signal match, and thereafter to select the second error signal, the multiplexer having an output connected to the input of the filter/VCO to provide the first or second error signal to the filter/VCO.

2. The PLL circuit of claim 1, wherein the reference signal generator is further configured to equalize the second reference signal.

3. The PLL circuit of claim 2, wherein the reference signal generator includes:

a first frequency doubler configured to double the first reference signal frequency to produce an intermediate reference signal;

a first equalizer configured to restore a duty cycle of the intermediate reference signal;

a second frequency doubler configured to double the intermediate reference signal frequency to produce the second reference signal;

a second equalizer configured to restore a duty cycle of the second reference signal.

4. The PLL circuit of claim 3, wherein each one of the first and the second frequency doublers comprises:

a first delay circuit adapted to delay an input signal by a 90 degrees phase shift;

an XOR circuit configured to XOR the output of the first delay circuit and the input signal to produce an output signal having a frequency that is two times the frequency of the input signal.

5. The PLL circuit of claim 4, wherein each one of the first and second frequency doublers further comprises a second delay circuit, in which the first and second delay circuits are adapted to delay an input signal by a 45 degrees phase shift.

6. A method of operating a phase locked loop (PLL) having a voltage-controlled oscillator (VCO) that generates an output signal, comprising:

receiving a first reference signal;

quadrupling a frequency of the first reference signal to produce a second reference signal;

generating a first error signal based upon a frequency difference between the second reference signal and a first divided VCO output signal;

generating a second error signal based on a phase difference between the second reference signal and a second divided VCO output signal at each rising and falling transition of the second reference signal;

initially controlling the VCO with the first error signal; and when the first error signal is zero, thereafter controlling the VCO with the second error signal.

7. The method of claim 6, further comprising filtering the first or second error signal.

8. The method of claim 6, wherein quadrupling the frequency of the first reference signal to produce a second reference signal further includes equalizing a duty cycle of the second reference signal.

9. The method of claim 8, wherein quadrupling the frequency of the first reference signal to produce a second reference signal further includes:

doubling the frequency of the first reference signal to produce an intermediate reference signal;

equalizing the intermediate reference signal to produce an equalized intermediate reference signal;

doubling a frequency of the equalized intermediate reference signal to produce the second reference signal; and equalizing the second reference signal.

10. The method of claim 8, wherein equalizing a duty cycle of the second reference signal further includes reducing duty cycle distortions caused by quadrupling the frequency of the first reference signal.

11. A method of operating a phase locked loop (PLL) having a voltage-controlled oscillator (VCO) that generates an output signal, comprising:

receiving a first reference signal;

quadrupling a frequency of the first reference signal to produce a second reference signal;

generating a first divided VCO signal;

generating a second divided VCO signal;

generating a first error signal based on a frequency difference between the second reference signal and the first divided VCO output signal;

generating a second error signal based on a phase difference between the second reference signal and the second divided VCO output signal; and selecting the first error signal until the frequencies of the second reference signal and the first divided VCO output signal match, and thereafter selecting the second error signal.

12. The method of claim 11, wherein generating the second error signal further includes sampling the second reference signal at each rising and falling transition.

13. The method of claim 12, further comprising comparing the phase of the second reference signal with the phase of the second divided VCO output signal at each sampled transition.

* * * * *